United States Patent
Yamazaki et al.

(10) Patent No.: US 8,592,267 B2
(45) Date of Patent: Nov. 26, 2013

(54) SEMICONDUCTOR DEVICE AND MANUFACTURING METHOD OF THE SAME

(71) Applicant: Semiconductor Energy Laboratory Co., Ltd., Atsugi (JP)

(72) Inventors: Shunpei Yamazaki, Setagaya (JP); Yasuyuki Arai, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/748,916

(22) Filed: Jan. 24, 2013

(65) Prior Publication Data

US 2013/0130447 A1 May 23, 2013

Related U.S. Application Data

(62) Division of application No. 12/700,756, filed on Feb. 5, 2010, now Pat. No. 8,368,083.

(30) Foreign Application Priority Data

Feb. 20, 2009 (JP) ................. 2009-037717

(51) Int. Cl.
*H01L 21/8238* (2006.01)
(52) U.S. Cl.
USPC ............................................. 438/199; 257/77
(58) Field of Classification Search
USPC .............. 257/77, E21.054, E21.065; 438/931
See application file for complete search history.

(56) References Cited

U.S. PATENT DOCUMENTS

| | | | |
|---|---|---|---|
| 5,216,271 A | 6/1993 | Takagi et al. | |
| 5,614,425 A | 3/1997 | Kimura et al. | |
| 5,814,859 A | 9/1998 | Ghezzo et al. | |
| 5,877,515 A | 3/1999 | Ajit | |
| 5,877,518 A | 3/1999 | Sakurai et al. | |
| 6,002,143 A | 12/1999 | Terasawa | |
| 6,054,352 A | 4/2000 | Ueno | |
| 6,455,364 B1 | 9/2002 | Asai et al. | |
| 7,714,352 B2 | 5/2010 | Shimoida et al. | |
| 7,745,276 B2 | 6/2010 | Okuno et al. | |
| 2004/0227197 A1* | 11/2004 | Maekawa .................... 257/410 | |

(Continued)

FOREIGN PATENT DOCUMENTS

| | | | |
|---|---|---|---|
| JP | 2000-349282 A | 12/2000 | |
| JP | 2003-224428 A | 8/2003 | |

(Continued)

OTHER PUBLICATIONS

Chinese Office Action (Application No. 201010124800.6) Dated Aug. 6, 2013.

*Primary Examiner* — Thao Le
(74) *Attorney, Agent, or Firm* — Eric J. Robinson; Robinson Intellectual Property Law Office, P.C.

(57) ABSTRACT

At least part of a semiconductor layer or a semiconductor substrate includes a semiconductor region having a large energy gap. The semiconductor region having a large energy gap is preferably formed from silicon carbide and is provided in a position at least overlapping with a gate electrode provided with an insulating layer between the semiconductor region and the gate electrode. By making a structure in which the semiconductor region is included in a channel formation region, a dielectric breakdown voltage is improved.

20 Claims, 11 Drawing Sheets

(56) References Cited

U.S. PATENT DOCUMENTS

| | | |
|---|---|---|
| 2006/0267022 A1 | 11/2006 | Mizukami et al. |
| 2007/0007590 A1* | 1/2007 | Kinoshita et al. ............. 257/336 |
| 2008/0090383 A1 | 4/2008 | Nakamura et al. |
| 2008/0206909 A1* | 8/2008 | Maekawa ........................ 438/23 |
| 2010/0044721 A1 | 2/2010 | Fujikawa et al. |
| 2012/0056201 A1* | 3/2012 | Wada et al. ..................... 257/77 |
| 2013/0171778 A1* | 7/2013 | Wada et al. ................... 438/135 |

FOREIGN PATENT DOCUMENTS

| | | |
|---|---|---|
| JP | 2005-268460 A | 9/2005 |
| JP | 2006-032655 A | 2/2006 |
| JP | 2006-036613 A | 2/2006 |
| JP | 2006-228763 A | 8/2006 |
| JP | 2007-123675 A | 5/2007 |

\* cited by examiner

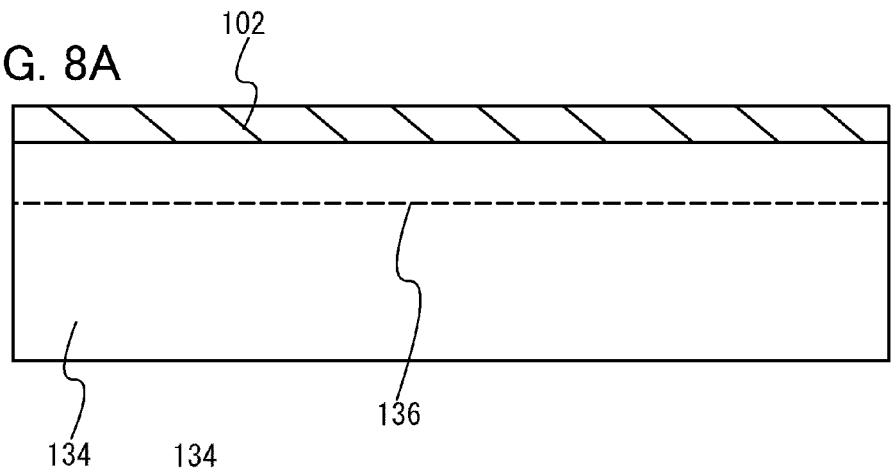
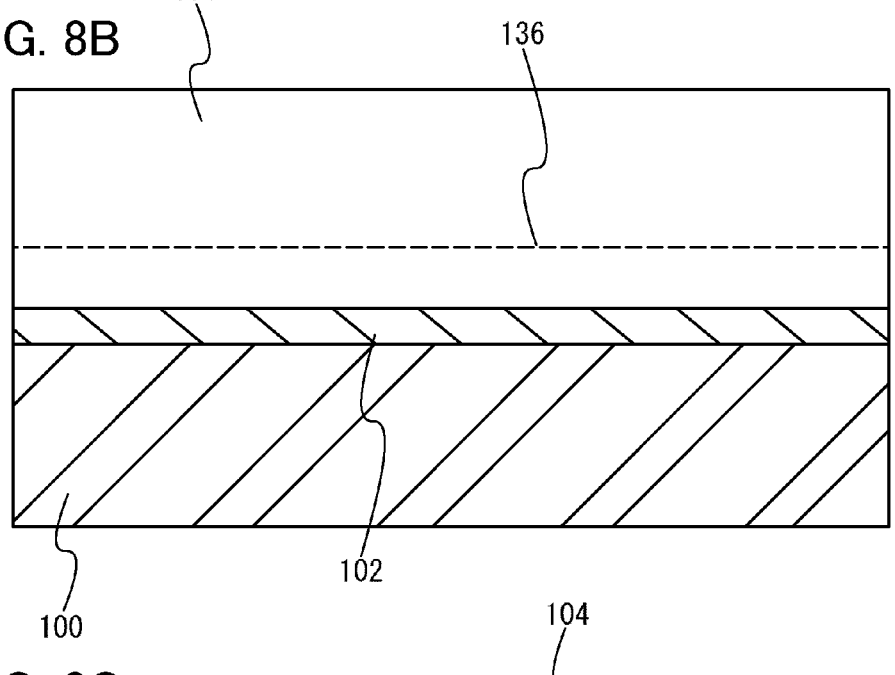
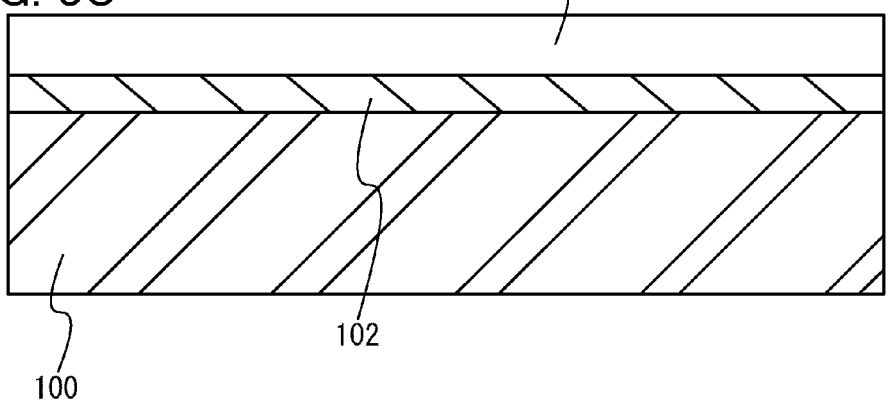

SEMICONDUCTOR DEVICE AND MANUFACTURING METHOD OF THE SAME

BACKGROUND OF THE INVENTION

1. Field of the Invention

One mode of this disclosed invention relates to semiconductor devices and a manufacturing method thereof. Further, one mode of the present invention relates to semiconductor devices which control a relatively large amount of electrical power.

2. Description of the Related Art

An energy gap of a silicon carbide semiconductor (4H—SiC) is 3.02 eV, which is about three times that of a silicon semiconductor, 1.12 eV. A dielectric breakdown electric field of a silicon semiconductor is 0.3 MV/cm while a dielectric breakdown electric field of a silicon carbide semiconductor is 3.5 MV/cm, which is more than ten times as high as that of a silicon semiconductor. Therefore, the use of a silicon carbide semiconductor for electrical devices typified by inverters and converters is expected.

In spite of those advantages, commercialization of transistors utilizing a silicon carbide semiconductor has not been realized because of low quality of silicon carbide semiconductor substrates and difficulty in increasing a size of the substrates.

Specifically, it has been found that defects of a silicon carbide substrate should be reduced. There is a problem in that a silicon carbide substrate has hollow-core defects called micropipes and only one micropipe in a transistor prevents the transistor from functioning. Besides the hollow-core defects, a silicon carbide substrate has many defects such as dislocation. In order to manufacture a high-quality silicon carbide substrate, a high-quality silicon carbide semiconductor layer is tried to be grown on a semiconductor substrate by homoepitaxial growth and heteroepitaxial growth, for example (see Patent Documents 1 and 2).

Although attempts have been made to improve quality of a silicon carbide substrate, a problem of a small size of the substrate is still to be solved. The size of a single crystal silicon substrate is 12 inch. On the other hand, the size of a silicon carbide substrate is still 3 inch generally. This is because crystal growth of a silicon carbide semiconductor is difficult to control. After all, although devices including a silicon carbide semiconductor are expected to be high performance devices, their commercialization is delayed in practice due to low quality of crystals and low productivity.

[Patent Document 1] Japanese Published Patent Application No. 2006-032655

[Patent Document 2] Japanese Published Patent Application No. 2006-036613

SUMMARY OF THE INVENTION

In view of the foregoing problems, an object is to provide a semiconductor device including a silicon carbide semiconductor. In addition, another object is to improve productivity of the semiconductor device including a silicon carbide semiconductor.

In one embodiment of the present invention, the above problems are solved by making a semiconductor substrate at least a part of which includes a silicon carbide semiconductor layer, not by making a semiconductor substrate the entire part of which is a silicon carbide semiconductor. When a silicon semiconductor substrate is used as a semiconductor substrate, the size of the substrate can be increased. By silicon-carbonizing one surface of the substrate, a large semiconductor substrate having a silicon carbide semiconductor layer can be obtained. By using such a semiconductor substrate, a semiconductor device in which part or the whole of an active region of an element, such as a transistor, is formed from a silicon carbide semiconductor can be obtained.

A semiconductor device according to one embodiment of the present invention includes a semiconductor layer formed on an insulating surface and at least part of the semiconductor layer is a semiconductor region having a larger energy gap than the semiconductor layer. The semiconductor region having a large energy gap is provided in a position at least overlapping with a gate electrode provided with an insulating layer interposed between the semiconductor layer and the gate electrode. A structure in which the semiconductor region having a larger energy gap than the semiconductor layer is included in a channel formation region has an effect of improving a dielectric breakdown voltage. The semiconductor layer is preferably single crystal or polycrystal, and the semiconductor region having a larger energy gap than the semiconductor layer also preferably has a crystalline structure. A preferable combination of materials is a silicon semiconductor and a carbide semiconductor, which are a material for forming the semiconductor layer and a semiconductor material having a larger energy gap than the semiconductor layer, respectively. As a carbide semiconductor, a silicon carbide is preferably used. As a silicon semiconductor, single crystal silicon is preferable, but polycrystal silicon can also be used.

A semiconductor device according to one embodiment of the present invention includes a semiconductor layer having one conductivity type formed on an insulating surface, a carbide semiconductor region provided in at least a part of the semiconductor layer, a gate insulating layer provided over the carbide semiconductor region, a gate electrode provided over the gate insulating layer, a first impurity region having an opposite conductivity type to the one conductivity type, overlapping with a part of the gate electrode, and including at least the carbide semiconductor region, a second impurity region having the one conductivity type which is formed in the first impurity region and substantially outside a region under the gate electrode and includes at least the carbide semiconductor region, a source electrode being in contact with the first impurity region and the second impurity region, and a drain electrode being in contact with the semiconductor layer.

A semiconductor device according to one embodiment of the present invention includes a semiconductor layer having one conductivity type formed on an insulating surface, a carbide semiconductor region provided in at least a part of the semiconductor layer, a gate insulating layer provided over the carbide semiconductor region, a gate electrode provided over the gate insulating layer, a first impurity region having an opposite conductivity type to the one conductivity type, overlapping with a part of the gate electrode, and including at least the carbide semiconductor region, a second impurity region having the one conductivity type which is formed in the first impurity region and substantially outside a region under the gate electrode and includes at least the carbide semiconductor region, an emitter electrode being in contact with the first impurity region and the second impurity region, and a collector electrode being in contact with a third impurity region having the opposite conductivity type to the one conductivity type which is formed in the semiconductor layer.

In the semiconductor device of the above embodiments, the semiconductor layer is preferably single crystal, but may be polycrystal. Further, instead of the semiconductor layer provided on the insulating surface, a semiconductor substrate can be employed.

Further, a method for manufacturing a semiconductor device is also given. The method includes forming a carbide semiconductor region by heating a semiconductor in an atmosphere containing a carbide gas to carbonize a surface portion of the semiconductor, and forming a gate electrode with an insulating layer interposed between the gate electrode and the semiconductor in order that a channel formation region is formed in the carbide semiconductor region. As well as the carbonization treatment on a semiconductor substrate, carbonization treatment on a semiconductor layer on a substrate having an insulating surface falls within the scope of one embodiment of the present invention. As a carbide gas, a hydrocarbon gas such as methane or propane is preferably used.

The heat treatment of the carbonization treatment may include irradiation of the semiconductor with laser light, in addition to heating of the substrate. The entire surface of the semiconductor may be irradiated with laser light at a time or may be irradiated with a pulsed laser or a continuous wave laser sequentially.

Note that the ordinal numbers such as "first" and "second" in this specification are used for convenience and do not limit the order of steps and the stacking order of layers. In addition, elements accompanied by ordinal numbers such as "first" and "second" do not denote particular names which specify the present invention.

A semiconductor device which withstands high voltages can be obtained by forming part or the whole of a channel formation region of a transistor from a carbide semiconductor region. By heating a semiconductor substrate or a substrate provided with a semiconductor layer in an atmosphere containing a carbide gas, a silicon carbide semiconductor layer can be formed. In this method, if the area of the semiconductor substrate or the semiconductor layer is increased, a larger apparatus may be used for heat treatment. Accordingly, a semiconductor device which includes a silicon carbide semiconductor can be manufactured without decreasing productivity.

BRIEF DESCRIPTION OF THE DRAWINGS

FIGS. 8A to 8C illustrate a manufacturing process of a substrate having an SOI structure.

DETAILED DESCRIPTION OF THE INVENTION

Figure 1A:
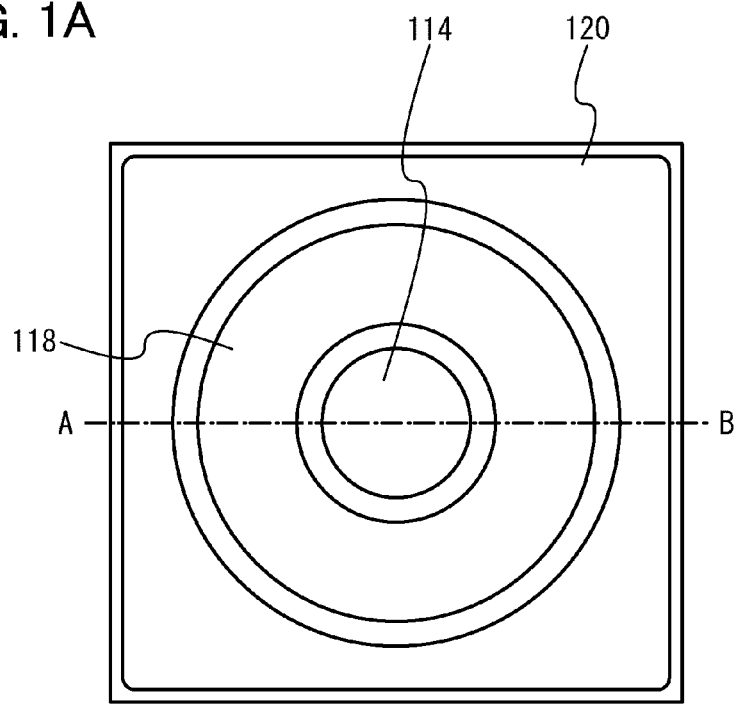
FIGS. 1A and 1B are respectively a plan view and a cross-sectional view which illustrate one mode of a semiconductor device having an SOI structure in which a semiconductor layer is provided over a support substrate with an insulating layer interposed therebetween.

Embodiments of the disclosed invention will be described in detail with reference to the drawings. Note that the disclosed invention is not limited to the following description and it will be readily appreciated by those skilled in the art that modes and details can be modified in various ways without departing from the spirit and the scope of the present invention. Accordingly, the disclosed invention should not be construed as being limited to the description of the embodiments to be given below. In embodiments described below, the same reference numerals may be used to denote the same components among different drawings.

Embodiment 1

Figure 1B:
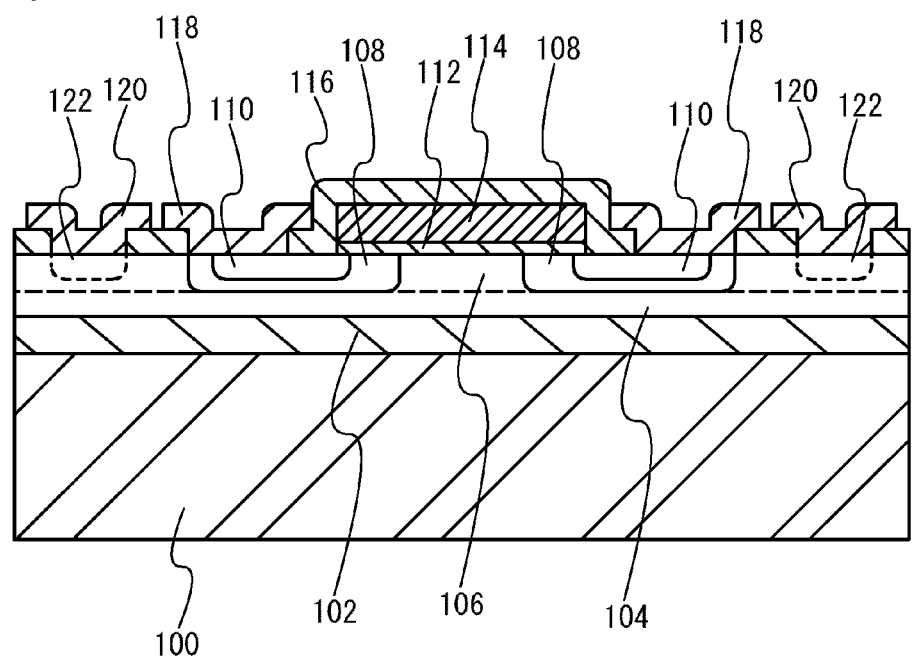

In this embodiment, an example of a semiconductor device having an SOI structure in which a semiconductor layer is provided over a support substrate with an insulating layer interposed therebetween is described. In this embodiment, an example of a structure for providing a semiconductor device including a silicon carbide semiconductor is described. FIG. 1A is a plan view of the semiconductor device and FIG. 1B is a cross-sectional view taken along dashed line A-B in the plan view.

FIG. 1A is a plan view of a semiconductor device in which a source electrode 118 is provided in the vicinity of a gate electrode 114. A drain electrode 120 is provided outside the source electrode 118. Hereinafter, a structure of a semiconductor device according to this embodiment is described with reference to FIG. 1A and a cross-sectional view in FIG. 1B.

[Support Substrate]

A substrate having a flat surface, for example, an insulating substrate, a semiconductor substrate, a metal substrate can be employed as a support substrate 100. Note that the support substrate 100 preferably has a heat resistance to withstand temperatures of 500° C. or higher.

A quartz substrate is a preferable example of the support substrate 100. Alternatively, a glass substrate whose strain point is 700° C. or higher can be used. A silicon substrate (a silicon wafer) is given as a typical example of a semiconductor substrate. A silicon substrate whose surface is polished to be flat may be used. An inexpensive silicon substrate which is at a so-called solar cell level can also be used. For example, a silicon substrate with about 6N purity (99.9999%) to 7N purity (99.99999%) can be used as the support substrate 100. In this case, it is preferable that a surface of the silicon substrate be heated to 700° C. to 1150° C., preferably 800° C. to 1050° C. in an oxidizing atmosphere containing hydrogen chloride at 0.5 vol % to 10 vol % (preferably, at 3 vol %) so that an oxide film is formed. In the case of using a metal substrate, a surface is polished to be flat and an insulating layer described below is formed.

[Insulating Layer Over Support Substrate]

An insulating layer 102 provided over the support substrate 100 preferably has a planarity. Therefore, silicon oxide, silicon oxynitride, silicon nitride, or the like is employed for the insulating layer 102. An insulating layer of any of those materials including silicon can be formed by a sputtering method or a vapor deposition method.

In the case where a silicon substrate is used as the support substrate, an insulating layer may be formed on the surface of the silicon substrate by a thermal oxidation method. In the case where the silicon substrate is at a solar cell level, impurities such as metal can be reduced by thermal oxidation on the silicon substrate in an oxygen atmosphere containing HCl.

[Semiconductor Layer]

A semiconductor layer 104 is formed over the support substrate 100 with the insulating layer 102 interposed therebetween. As for the semiconductor layer 104, a single crystal semiconductor is preferable but a polycrystal semiconductor can be alternatively used. Typically, a single crystal silicon semiconductor is employed. The semiconductor layer 104 has either n-type or p-type conductivity. The thickness of the semiconductor layer 104 is about 50 nm to 500 nm.

[Carbide Semiconductor Region]

A carbide semiconductor region 106 is formed inside a surface of the semiconductor layer 104. This carbide semiconductor region 106 has a larger energy gap than a silicon semiconductor. Similarly to the semiconductor layer 104, the carbide semiconductor region 106 is preferably formed from a semiconductor material which contains silicon as a component. A silicon carbide semiconductor is preferably employed. The carbide semiconductor region 106 is formed down to the depth of at least 5 nm to 15 nm from the surface of the semiconductor layer 104. In the case where the semiconductor layer 104 is a silicon semiconductor, the carbide semiconductor region 106 is formed from silicon carbide.

The carbide semiconductor region 106 may be provided throughout the surface of the semiconductor layer 104 or selectively provided in a region which serves as a channel formation region of a transistor as is described below. In the above manner in which a silicon carbide semiconductor region is formed in a crystallized semiconductor layer rather than forming a silicon carbide substrate itself, a silicon carbide semiconductor region with improved crystallinity can be obtained. By utilizing this silicon carbide semiconductor region, a semiconductor element such as a transistor can be manufactured.

[First Impurity Region]

A first impurity region 108 is a region with an opposite conductivity type to the conductivity type of the semiconductor layer 104. For example, if the semiconductor layer 104 is of n-type, the first impurity region 108 is a p-type region.

The first impurity region 108 is formed to overlap with the gate electrode 114 and the source electrode 118. The thickness of the first impurity region 108 may be approximately the same as that of the carbide semiconductor region 106. Since current flows between the source electrode 118 and the drain electrode 120 through the channel formation region (part of the first impurity region 108 which overlaps with the gate electrode 114), the semiconductor layer 104 should remain under the first impurity region 108.

[Second Impurity Region]

A second impurity region 110 is formed in the first impurity region 108. The second impurity region 110 has the same conductivity type as the semiconductor layer 104. The second impurity region 110 is provided in a region which overlaps with an end portion of the gate electrode 114 and the source electrode 118. The second impurity region 110 serves as a so-called source region.

The thickness of the second impurity region 110 is controlled so that the second impurity region 110 does not reach the bottom of the first impurity region 108. This is because if the second impurity region 110, which has the same conductivity type as the semiconductor layer 104, goes through the first impurity region 108, the source electrode 118 and the drain electrode 120 are substantially short-circuited.

[Gate Insulating Layer]

A gate insulating layer 112 is formed from an insulating film which is obtained by oxidizing the semiconductor layer 104 (including the carbide semiconductor region 106). Alternatively, the gate insulating layer 112 is formed by depositing an insulating film over the semiconductor layer 104.

As for oxidation of the semiconductor layer 104 (including the carbide semiconductor region 106), a dry oxidation method, a pyrogenic oxidation method (a wet oxidation method) in which hydrogen and oxygen are burnt to generate water vapor and the water vapor and oxygen are used for oxidation, a method in which thermal oxidation is performed by mixing hydrogen chloride with oxygen, or the like can be employed. Alternatively, the gate insulating layer 112 may be formed by performing plasma treatment on a surface of the semiconductor layer 104 (including the carbide semiconductor region 106). In the plasma treatment here, oxygen radicals generated in plasma react with the semiconductor surface and oxidation reaction proceeds even at low temperatures. Therefore, an oxidation film can be formed at a temperature of 1000° C. or lower on a silicon carbide semiconductor, which is relatively difficult to oxidize.

In the case of depositing the gate insulating layer 112 over the semiconductor layer 104 (including the carbide semiconductor region 106), a thermal CVD method or a plasma CVD method by which a silicon oxide film or a silicon oxynitride film is formed can be employed.

[Gate Electrode]

The gate electrode 114 is provided over the gate insulating layer 112. The gate electrode 114 is provided over the gate insulating layer 112, thereby being insulated from the semiconductor layer 104 (including the carbide semiconductor region 106). The gate electrode 114 is preferably covered with an insulating layer 116. The insulating layer 116 ensures insulation between the gate electrode 114 and the source electrode 118.

[Source Electrode and Drain Electrode]

The source electrode 118 is provided to be in contact with the second impurity region 110. Further, the source electrode 118 is located to be in contact with not only the second impurity region 110 but the first impurity region 108 outside the gate electrode 114, whereby a pn junction is substantially formed between the source electrode 118 and the neighboring drain electrode 120.

In normal operation, the source electrode 118 is negatively biased while the drain electrode 120 is positively biased, whereby the pn junction formed between the source electrode 118 and the drain electrode 120 is biased in the reverse direction. Thus, leakage current between the source electrode 118 and the drain electrode 120 is reduced.

The drain electrode 120 is provided in a region outside the source electrode 118. The drain electrode 120 is in contact with a third impurity region 122 having the same conductivity type as the second impurity region 110. In a path through which current flows, the second impurity region 110, the first impurity region 108, the carbide semiconductor region 106, the semiconductor layer 104, and the third impurity region 122 are sandwiched between the source electrode 118 and the drain electrode 120. Here, because of the presence of the first impurity region 108 formed from a carbide semiconductor and the carbide semiconductor region 106, voltages that can be withstood can be high.

Modification Example

Figure 2A:
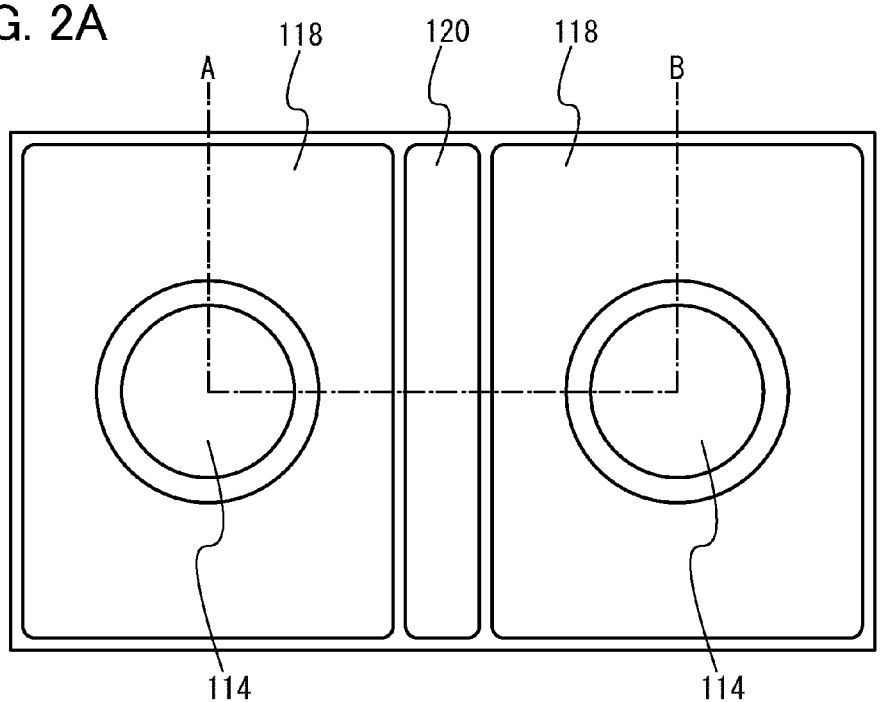
FIGS. 2A and 2B are respectively a plan view and a cross-sectional view which illustrate one mode of a semiconductor device having an SOI structure in which a semiconductor layer is provided over a support substrate with an insulating layer interposed therebetween.
Figure 2B:
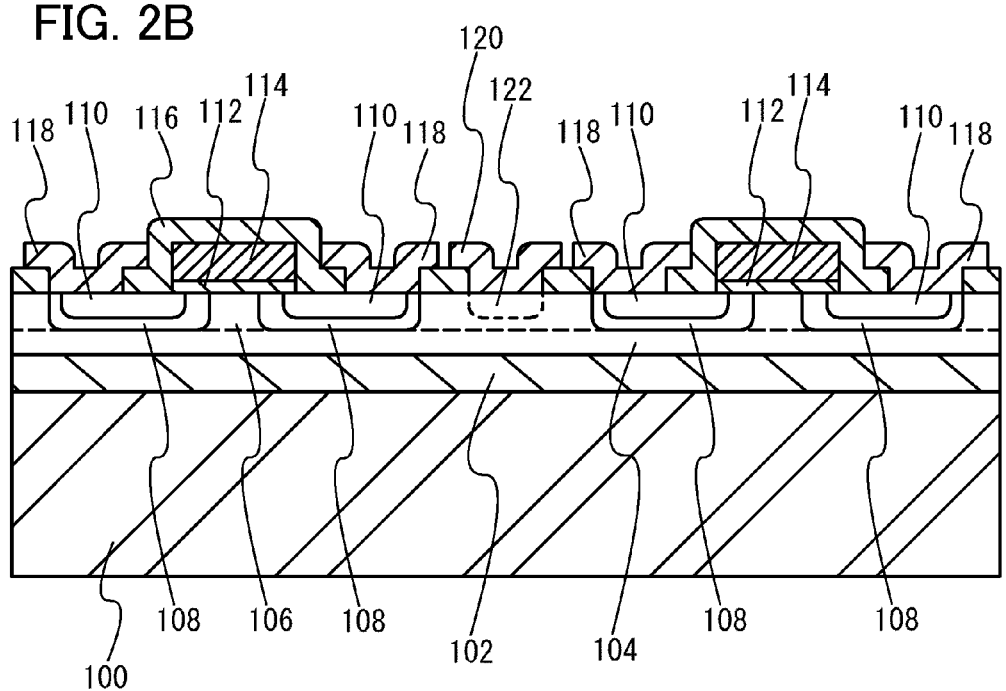
Figure 3A:
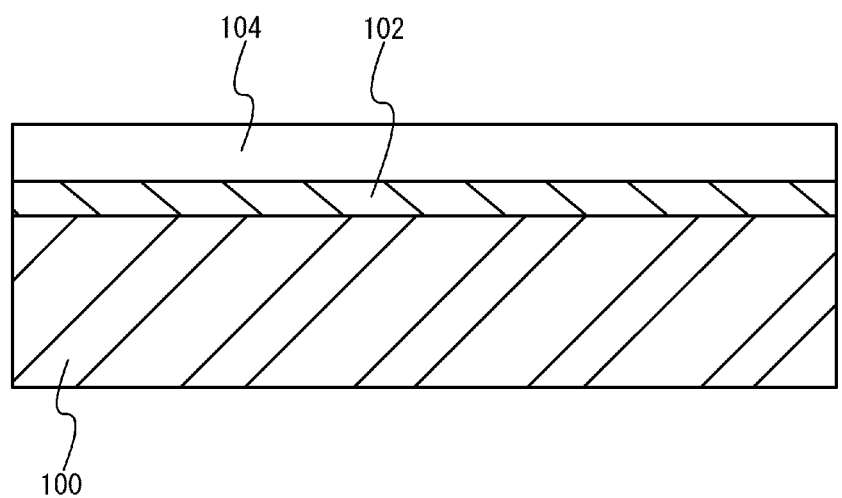
FIGS. 3A and 3B illustrate an example of a manufacturing process of a semiconductor device having an SOI structure.
Figure 3B:
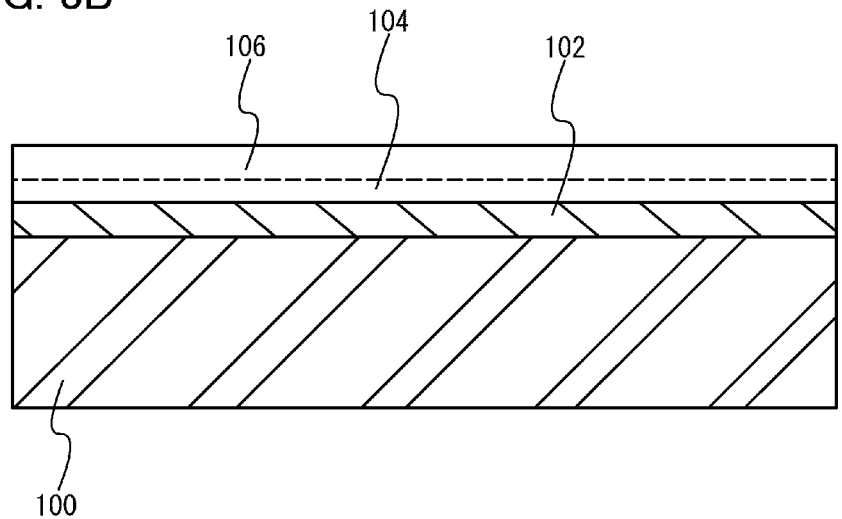
Figure 4A:
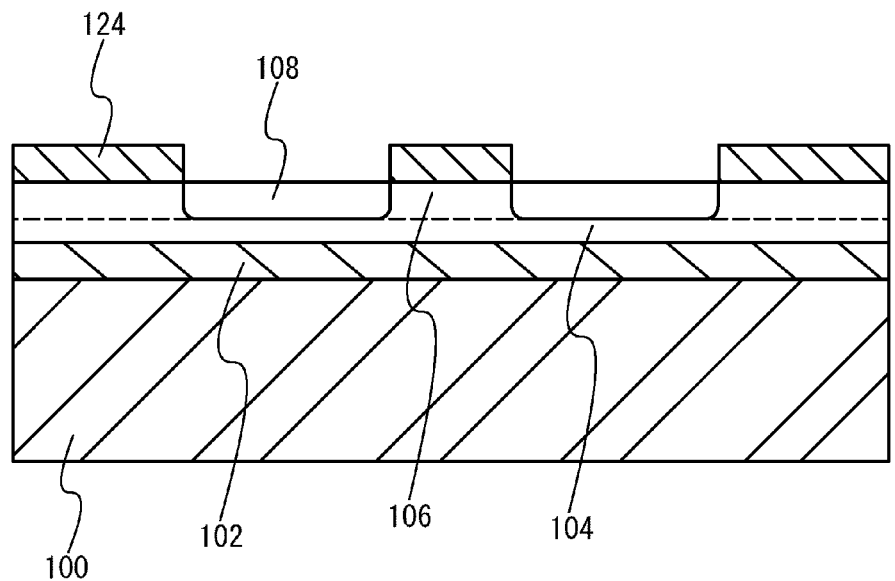
FIGS. 4A and 4B illustrate an example of a manufacturing process of a semiconductor device having an SOI structure.
Figure 4B:
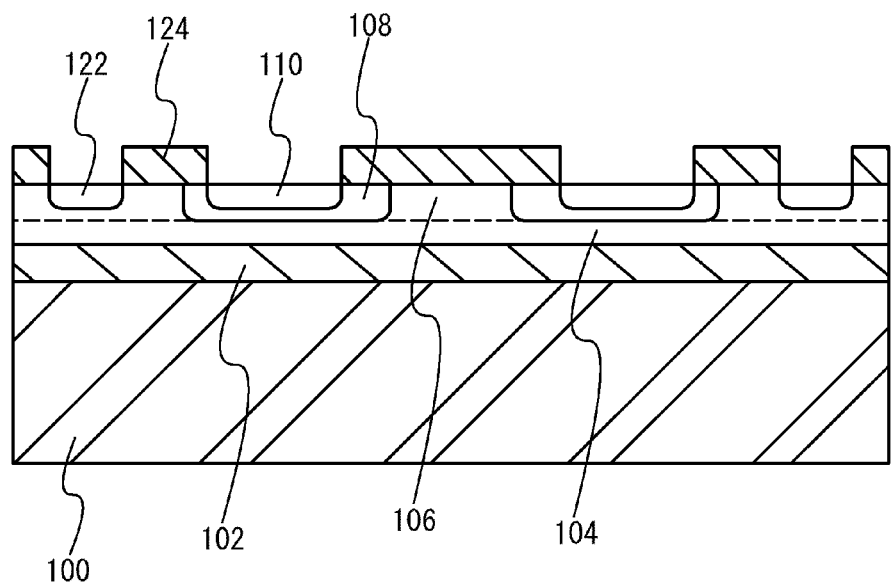
Figure 5A:
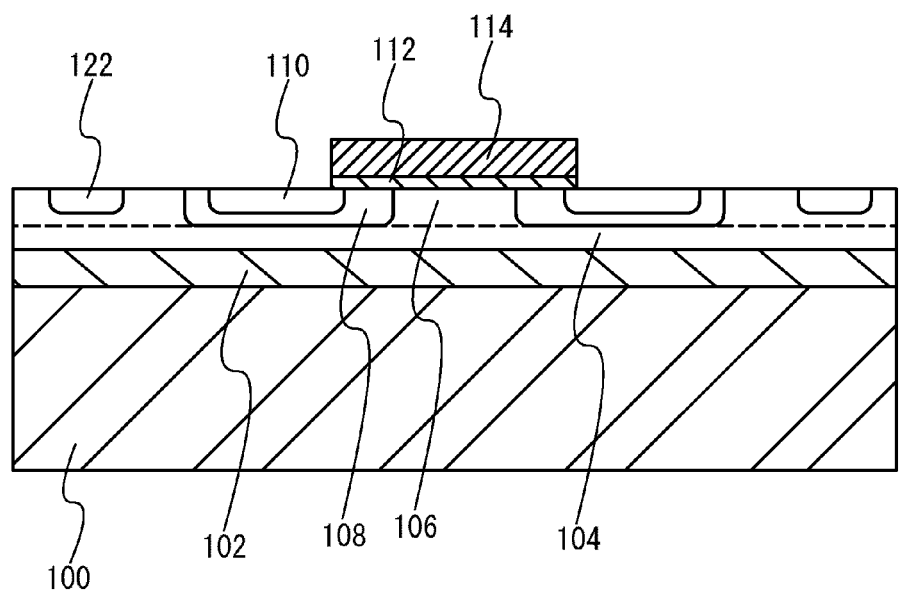
FIGS. 5A and 5B illustrate an example of a manufacturing process of a semiconductor device having an SOI structure.
Figure 5B:
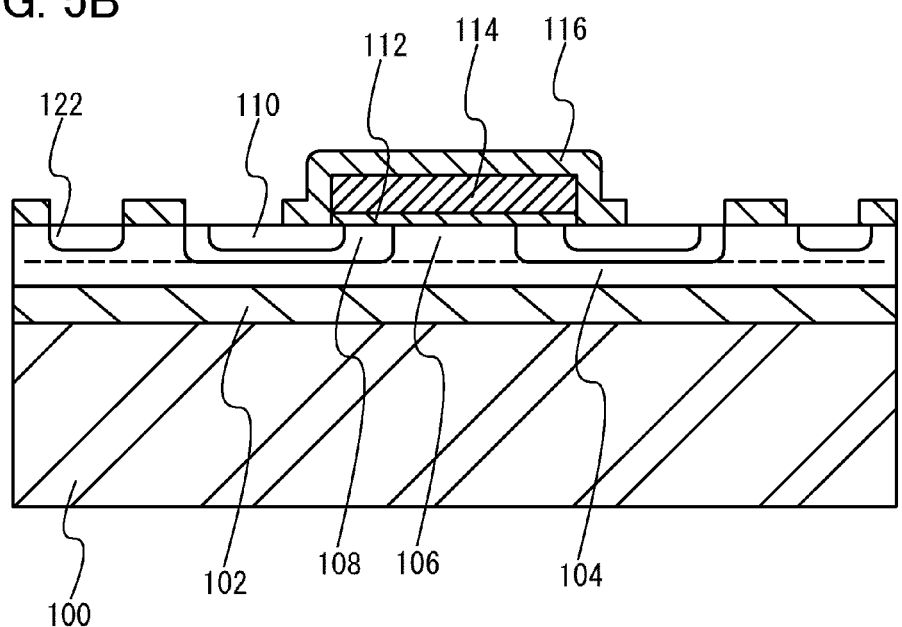

FIGS. 2A and 2B illustrate an example of a semiconductor device in which a pair of gate electrodes 114 and a pair of source electrodes 118 are provided on opposite sides of the drain electrode 120. With a structure in which two channel formation regions are provided in the support substrate 100 and the drain electrode 120 is sandwiched by the two source electrodes 118, a device can be downsized while allowing a large amount of current to flow. Such a semiconductor device is suitable for applications with high rated current.

[Operation of Semiconductor Device]

In the case where the semiconductor layer 104 has an n-type conductivity, the first impurity region 108 has a p-type conductivity, and the second impurity region 110 has an n-type conductivity, an npn junction is formed between the source electrode 118 and the drain electrode 120. Accordingly, when bias is not applied to the gate electrode, only a small amount of current flows.

When positive bias is applied to the gate electrode 114, in the first impurity region 108 which overlaps with the gate electrode 114, negative charges (electrons) are induced near the interface with the gate insulating layer 112, whereby current flows between the source electrode 118 and the drain electrode 120. The channel formation region is formed in a region of the first impurity region 108 which overlaps with the gate electrode 114. The first impurity region 108 is provided in the carbide semiconductor region 106.

When the channel formation region is formed in the first impurity region 108 in the carbide semiconductor region 106, the dielectric breakdown voltage is improved. This is because, in a Si—C bond, the interatomic distance is as small as about 0.18 nm, the binding energy is high, and an energy gap of a silicon carbide semiconductor is about three times that of a silicon semiconductor.

Accordingly, in the case where the channel formation region is formed in the carbide semiconductor region, specific on resistance can be about 2 digits smaller than in the case where the channel formation region is formed from a silicon semiconductor. Further, since a carbide semiconductor has a thermal conductivity approximately three times as high as silicon, heat can be dissipated efficiently. Therefore, an electric current density per unit area in the semiconductor device is increased.

Embodiment 2

In this embodiment, an example of a method of manufacturing the semiconductor device described in Embodiment 1 is described with reference to FIGS. 3A and 3B, FIGS. 4A and 4B, and FIGS. 5A and 5B. An object of this embodiment is to provide a semiconductor device including a silicon carbide semiconductor. In addition, another object of this embodiment is to improve productivity of the semiconductor device including a silicon carbide semiconductor.

[Manufacture or Preparation of Support Substrate (see FIG. 3A)]

The semiconductor layer 104 is formed over the support substrate 100 with the insulating layer 102 interposed therebetween. This is a so-called SOI structure in which a semiconductor layer is provided over an insulating surface. Therefore, SOI substrates which are commercially available such as a bonded SOI substrate, a SIMOX (separation by implanted oxygen) substrate, or the like can be employed. A material of the semiconductor layer 104 is preferably single crystal silicon, but other semiconductor materials can be used. The semiconductor layer 104 has, for example, an n-type conductivity.

[Formation of Carbide Semiconductor Region (see FIG. 3B)]

The carbide semiconductor region 106 is formed inside a surface of the semiconductor layer 104. The carbide semiconductor region 106 includes an element which has an effect of increasing the energy gap of a material of the semiconductor layer 104 so that the carbide semiconductor region 106 has a larger energy gap than the semiconductor layer 104. For example, treatment for impregnating the semiconductor layer 104 with a specific element is performed.

For a specific example, in the case where the semiconductor layer 104 is formed from a single crystal silicon semiconductor, heat treatment is performed at 1000° C. to 1300° C., preferably, 1100° C. to 1250° C. in a mixed gas atmosphere in which a hydrocarbon gas such as methane or propane is mixed with a hydrogen gas serving as a carrier gas. By this treatment, the semiconductor layer 104 is impregnated with carbon from the surface to the depth of 5 nm to 20 nm, whereby the carbide semiconductor region 106 can be formed.

Further, in a mixed gas atmosphere of hydrogen and a hydrocarbon gas, the semiconductor layer 104 may be irradiated with laser light in order to be impregnated with carbon. In this case, it is preferable that the laser light be delivered in a manner such that at least a surface portion of the semiconductor layer 104 is melt. If laser light irradiation is performed when the semiconductor layer 104 is being heated at 500° C. to 1000° C., formation of the carbide semiconductor region 106 is facilitated and re-single-crystallization after laser irradiation is further promoted.

While the energy gap of single crystal silicon is 1.12 eV, the energy gap of silicon carbide is about 2.2 eV to 3.1 eV (e.g., an energy gap of 4H—SiC is 3.02 eV). By introducing carbon to single crystal silicon, the energy gap can be approximately doubled or tripled. In addition, in order to increase the thickness of the region with an increased energy gap, a silicon carbide layer may be epitaxially grown over the carbide semiconductor region 106.

[Formation of First Impurity Region (see FIG. 4A)]

A first mask layer 124 is formed over the semiconductor layer 104. The first mask layer 124 is provided with an opening in a region where the first impurity region 108 is to be formed. An impurity element imparting an opposite conductivity type to the conductivity type of the semiconductor layer 104 is added to the first impurity region 108. If the semiconductor layer 104 has an n-type conductivity, boron, which imparts a p-type conductivity, is added.

[Formation of Second Impurity Region (see FIG. 4B)]

A second mask layer 126 is formed over the semiconductor layer 104. The second mask layer 126 is provided with an opening in a region where the second impurity region 110 is to be formed. In other words, the second mask layer 126 is provided in a manner such that its opening is located over an inner region of the first impurity region 108.

An impurity element which imparts the same conductivity type as that of the semiconductor layer 104 is added to the second impurity region 110. If the semiconductor layer 104 has an n-type conductivity, phosphorus or arsenic, which impart an n-type conductivity, is added. At the same time, the third impurity region 122 which has the same conductivity type as the second impurity region 110 may also be formed. Note that the third impurity region 122 is not essential and is preferably provided for easily making an ohmic contact with the drain electrode 120.

[Formation of Insulating Gate (see FIG. 5A)]

The gate insulating layer 112 is formed by oxidizing a surface of the semiconductor layer 104 (including the carbide semiconductor region 106). Alternatively, the gate insulating layer 112 is formed by depositing an insulating layer over the semiconductor layer 104. As an oxidizing method, a dry oxidation method, a pyrogenic oxidation method (a wet oxidation method) in which hydrogen is burnt to generate water vapor and the water vapor and oxygen are used for oxidation, an HCl oxidation method in which hydrogen chloride is mixed with oxygen, or the like can be employed. Alternatively, as another oxidation method, a plasma oxidation method may be employed for forming the gate insulating layer 112. In the plasma oxidation method here, oxygen radicals generated in plasma react with the semiconductor surface and oxidation reaction proceeds even at low temperatures. In the case of depositing the gate insulating layer 112, a thermal CVD method or a plasma CVD method by which a silicon oxide film or a silicon oxynitride film is formed is employed.

The gate electrode 114 is formed over the gate insulating layer 112. The gate electrode 114 is formed from polysilicon or a metal material. As the metal material, a metal such as molybdenum, tungsten, or titanium or an alloy of any of those refractory metals may be used. The gate electrode 114 is formed to overlap with the carbide semiconductor region 106 and the first impurity region 108 with the gate insulating layer 112 interposed therebetween. In this structure, a region of the first impurity region 108 overlapping with the gate electrode 114 serves as a channel formation region. Note that in a plan view of FIG. 1A, the gate electrode 114 is positioned to be surrounded by the source electrode 118.

[Formation of Protective Film (see FIG. 5B)]

The insulating layer 116 is formed over the gate electrode 114. Then, contact holes are formed in the insulating layer 116. After that, the source electrode 118 and the drain electrode 120 are formed in regions where the contact holes in the insulating layer 116 are provided. In such a manner, the semiconductor device in FIGS. 1A and 1B can be obtained.

By following the process described above, a semiconductor device including the carbide semiconductor region 106 can be obtained. This manufacturing process includes treatment in which the semiconductor layer 104 is impregnated with carbon. In this process, even when the area of the support substrate 100 is increased, the semiconductor layer 104 corresponding to the area of the support substrate 100 is provided easily; accordingly, the carbide semiconductor region 106 having a large area is also provided easily. In other words, without manufacturing a large-diameter silicon carbide substrate, by forming a silicon carbide semiconductor region inside a surface of the semiconductor layer, a high-voltage and low-power-loss semiconductor device can be obtained. Further, according to a manufacturing method of this embodiment, productivity of the semiconductor device including a silicon carbide semiconductor can be improved.

Figure 6A:
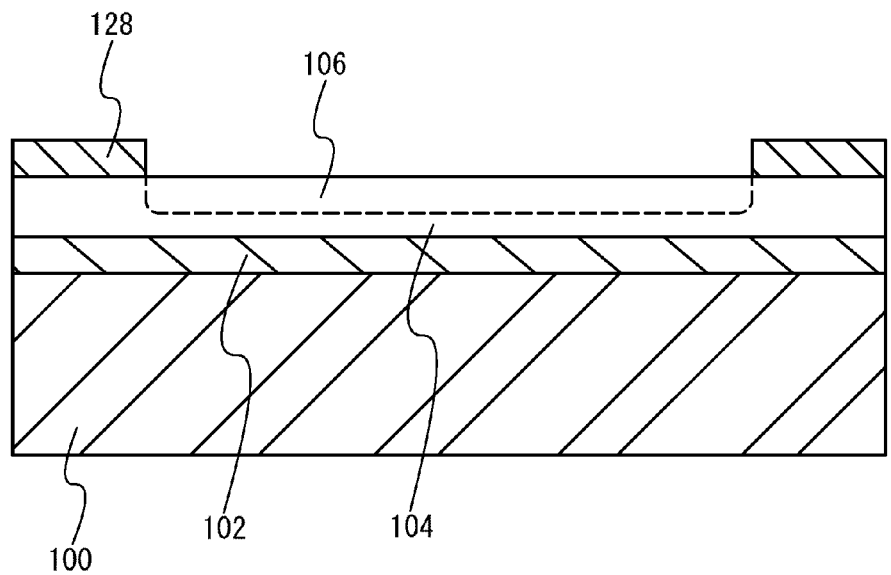
FIGS. 6A and 6B illustrate an example of a manufacturing process of a semiconductor device having an SOI structure.
Figure 6B:
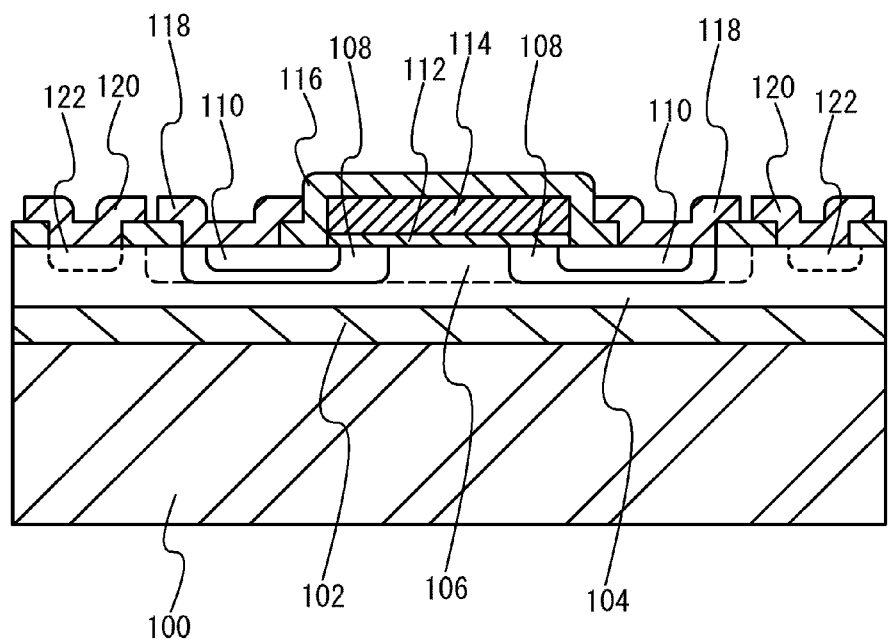

Modification Example with Selective Formation of Modified Layer (see FIGS. 6A and 6B)

If a third mask layer 128 having an opening is provided for forming the carbide semiconductor region 106 in the semiconductor layer 104, the carbide semiconductor region 106 can be selectively formed. Since treatment for forming the carbide semiconductor region 106 is performed at high temperatures, the third mask layer 128 is preferably formed from silicon oxide or silicon nitride.

Note that since a region of the first impurity region 108 which overlaps with the gate electrode 114 serves as a channel formation region, if the first impurity region 108 is included in the carbide semiconductor region 106, a semiconductor device which has an effect similar to that of the semiconductor device in FIGS. 1A and 1B can be obtained.

Embodiment 3

Figure 7A:
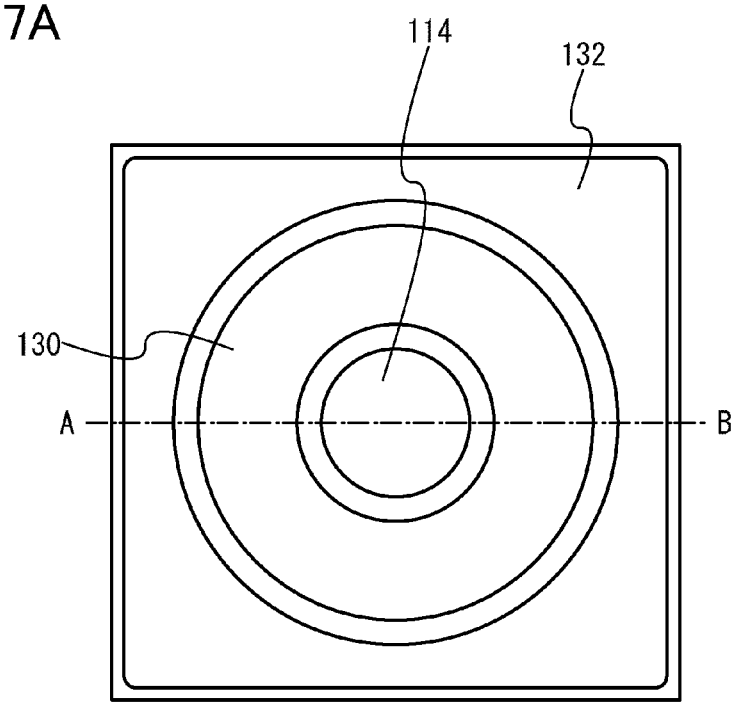
FIGS. 7A and 7B are respectively a plan view and a cross-sectional view which illustrate one mode of a semiconductor device having an SOI structure in which a semiconductor layer is provided over a support substrate with an insulating layer interposed therebetween.
Figure 7B:
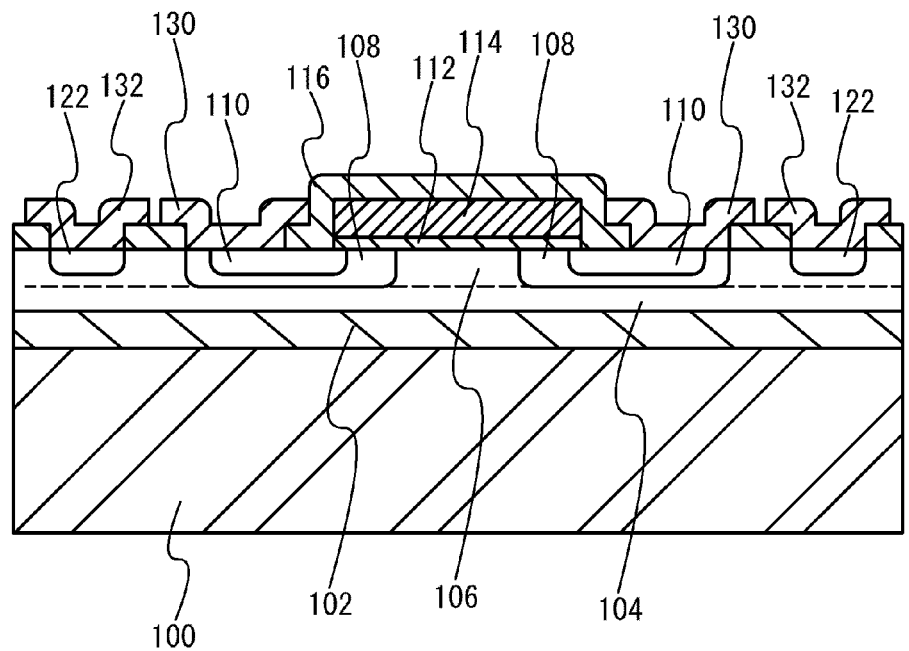

In this embodiment, an example of a semiconductor device which has an SOI structure in which a semiconductor layer is provided over a support substrate with an insulating layer interposed therebetween and which serves as a bipolar transistor is described. In this embodiment, an example of a structure for providing a semiconductor device including a silicon carbide semiconductor is described. FIG. 7A is a plan view of the semiconductor device and FIG. 7B is a cross-sectional view taken along dashed line A-B in the plan view.

The basic structure of the semiconductor device according to this embodiment is the same as that of the semiconductor device in FIGS. 1A and 1B, except that the third impurity region 122 has the same conductivity type as the first impurity region 108, that an emitter electrode 130 is in contact with the first impurity region 108 and the second impurity region 110, and that a collector electrode 132 is in contact with the third impurity region 122.

As in Embodiment 1, in the semiconductor device according to this embodiment, when positive bias is applied to the gate electrode 114, a channel region is formed in the first impurity region 108. Here, since the third impurity region 122 has a p-type conductivity, holes are injected to the semiconductor layer 104 from the third impurity region 122 in an On state. Thus, voltage to make the semiconductor device into an On state is lowered. In other words, a high-capacity semiconductor device which can withstand high voltages can be obtained.

The semiconductor device according to this embodiment has a structure of an insulated-gate field effect transistor on an input side and a structure of a bipolar transistor on an output side. This semiconductor device is driven with a voltage between the gate electrode 114 and the emitter electrode 130, and is turned on of off by input signals to the gate electrode 114. In this semiconductor device, switching operation can be faster. In addition, self-heating is suppressed due to low on resistance; therefore, this semiconductor device is suitably used for devices controlling a large amount of electrical power.

Embodiment 4

In this embodiment, an example of a method in which the semiconductor layer 104 is provided over the support substrate 100 described in Embodiments 1 to 3 is described.

[Step of Forming Separation Layer in Semiconductor Substrate (see FIG. 8A)]

A damaged layer 136 is formed in a semiconductor substrate 134 by introduction of ions. The semiconductor substrate 134 is formed from a single crystal semiconductor or a polycrystal semiconductor. As the semiconductor substrate 134, a single crystal silicon semiconductor substrate is typically employed. The insulating layer 102 provided over the semiconductor substrate 134 is formed from silicon oxide, silicon oxynitride, silicon nitride or the like. In formation of the damaged layer 136 in the semiconductor substrate 134, planarity of a surface of the semiconductor substrate 134 is damaged in some cases due to ion irradiation. Accordingly, the insulating layer 102 is preferably provided.

In order to form the damaged layer 136 at a predetermined depth from the surface of the semiconductor substrate 134, the semiconductor substrate 134 is irradiated with an ion beam including hydrogen ions. For example, the damaged layer 136 is formed at a certain depth from the surface using hydrogen ions mixed with hydrogen cluster ions. As for hydrogen cluster ions, $H_3^+$ ions are employed for example. By employing hydrogen cluster ions, more hydrogen atoms can be introduced to the semiconductor substrate 134 although the dose is not changed. Thus, formation of the damaged layer 136 is facilitated.

The distance between the damaged layer 136 and the surface of the semiconductor substrate 134 is controlled by acceleration energy of hydrogen ions. The thickness of the semiconductor layer 104 which is released from the semiconductor substrate 134 depends on the depth of the damaged layer 136. The damaged layer 136 is formed in a manner such that the hydrogen concentration reaches the maximum value at a depth of less than 1 μm from the surface of the semiconductor substrate 134, preferably, at a depth of 50 nm to 500 nm from the surface of the semiconductor substrate 134.

[Step of Attaching Semiconductor Substrate to Support Substrate (see FIG. 8B)]

A surface of the semiconductor substrate 134 provided with the insulating layer 102 is closely attached to the support substrate 100. When the support substrate 100 is closely attached to the insulating layer 102, the semiconductor substrate 134 is fixed to the support substrate 100 by hydrogen bonds or Van der Waals forces.

If the surfaces of the support substrate 100 and the insulating layer 102 are hydrophilic, hydroxyl groups and water molecules effectively act to facilitate formation of hydrogen bonds. Further, if heat treatment is performed, water molecules are decomposed to form silanol groups (Si—OH) and hydrogen bonds are further increased. If heat treatment at high temperatures is performed, hydrogen atoms are released and siloxane bonds (O—Si—O) are formed to form covalent bonds, whereby the attachment strength of the semiconductor substrate 134 and the support substrate 100 is improved.

[Step of Releasing Semiconductor Substrate to Form Semiconductor Layer Over Support Substrate (see FIG. 8C)]

While the semiconductor substrate 134 and the support substrate 100 are attached to each other, heat treatment is performed. The heat treatment is performed at temperatures ranging from 400° C. to 700° C. The heat treatment embrittles the damaged layer 136, whereby the semiconductor substrate 134 can be released with the semiconductor layer 104 left over the support substrate 100. The substrate described thus far can be used for manufacture of the semiconductor device in Embodiments 1 and 2.

Embodiment 5

Figure 9A:
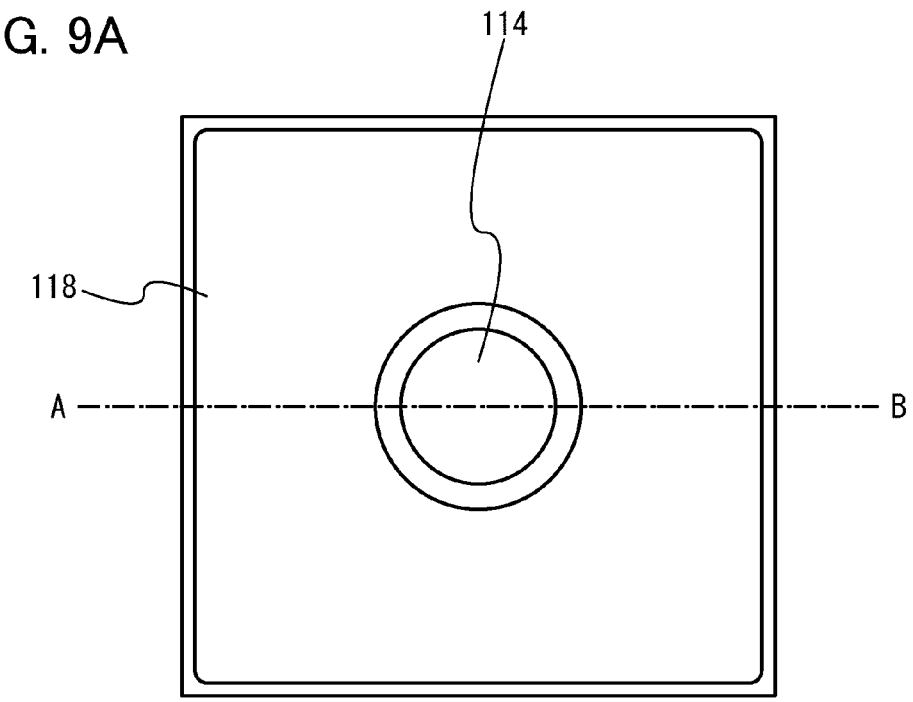
FIGS. 9A and 9B are respectively a plan view and a cross-sectional view which illustrate one mode of a semiconductor device formed using a semiconductor substrate.

In this embodiment, an example of a semiconductor device using a semiconductor substrate is described. In this embodiment, an example of a structure for providing a semiconductor device including a silicon carbide semiconductor is described. FIG. 9A is a plan view of the semiconductor device and FIG. 9B is a cross-sectional view taken along dashed line A-B in the plan view.

Figure 9B:
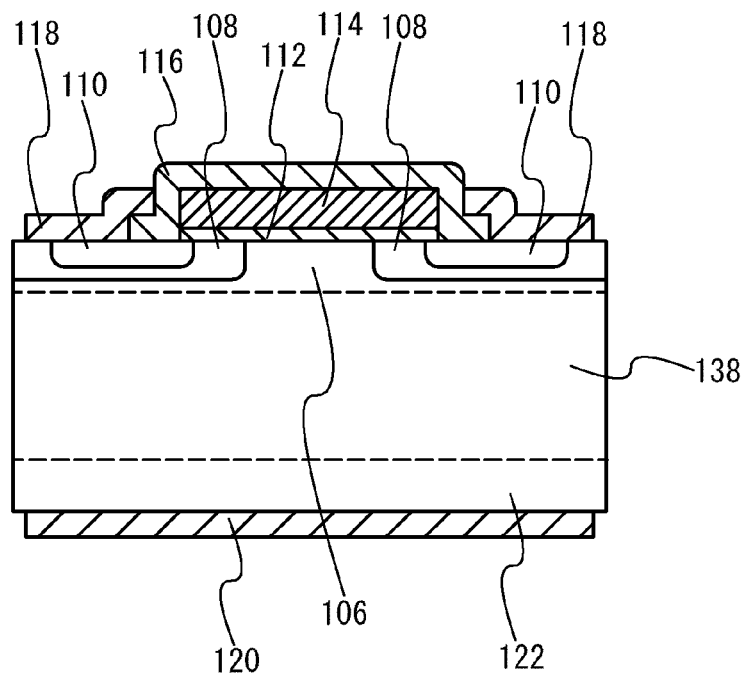

FIGS. 9A and 9B describe an example of a semiconductor device in which the carbide semiconductor region 106 is provided inside a surface of a semiconductor substrate 138, and part or the whole of a channel formation region is formed in the carbide semiconductor region 106.

Structures of the gate electrode 114, the first impurity region 108, the second impurity region 110, and the source electrode 118 are similar to those in Embodiment 1. The drain electrode 120 is provided on a rear surface of the semiconductor substrate 138 (the surface of the semiconductor substrate 138 opposite from the gate electrode). Note that in a region in which the drain electrode 120 is in contact with the semiconductor substrate 138, the third impurity region 122 which has the same conductivity type as the second impurity region 110 may be provided.

A surface part of the semiconductor substrate 138 is provided with the carbide semiconductor region 106. The energy gap of the carbide semiconductor region 106 is larger than that of a semiconductor material used for forming the semiconductor substrate 138. If the semiconductor substrate 138 is formed from a single crystal silicon semiconductor, a silicon carbide semiconductor is used for the carbide semiconductor region 106.

The carbide semiconductor region 106 is formed down to the depth of at least 5 nm to 15 nm from the surface of the semiconductor substrate 138. The depth of the first impurity region 108 from the surface of the semiconductor substrate may be smaller than that of the carbide semiconductor region 106 or may be about the same as or larger than that of the carbide semiconductor region 106. Thus, the channel formation region includes the carbide semiconductor region 106 at least as its part.

In the case where the semiconductor substrate 138 has an n-type conductivity, the first impurity region 108 has a p-type conductivity, and the second impurity region 110 has an n-type conductivity, an npn junction is formed between the source electrode 118 and the drain electrode 120. Accordingly, when bias is not applied to the gate electrode 114, only a small amount of current flows.

When positive bias is applied to the gate electrode 114, in the first impurity region 108 which overlaps with the gate electrode 114, negative charges (electrons) are induced near the interface with the gate insulating layer 112, whereby current flows between the source electrode 118 and the drain electrode 120. The channel formation region is formed in the first impurity region 108.

When the channel formation region is formed in the carbide semiconductor region 106, the dielectric breakdown voltage is improved. This is because, in a Si—C bond, the interatomic distance is as small as about 0.18 nm, the binding energy is high, and an energy gap of a silicon carbide semiconductor is about three times that of a silicon semiconductor.

Accordingly, in the case where the channel formation region is formed in the carbide semiconductor region 106, specific on resistance can be about 2 digits smaller than in the case where the channel formation region is formed in a silicon semiconductor substrate. Further, since a carbide semiconductor has a thermal conductivity approximately three times as high as silicon, heat can be dissipated efficiently. Therefore, an electric current density per unit area in the semiconductor device is increased.

Embodiment 6

Figure 10A:
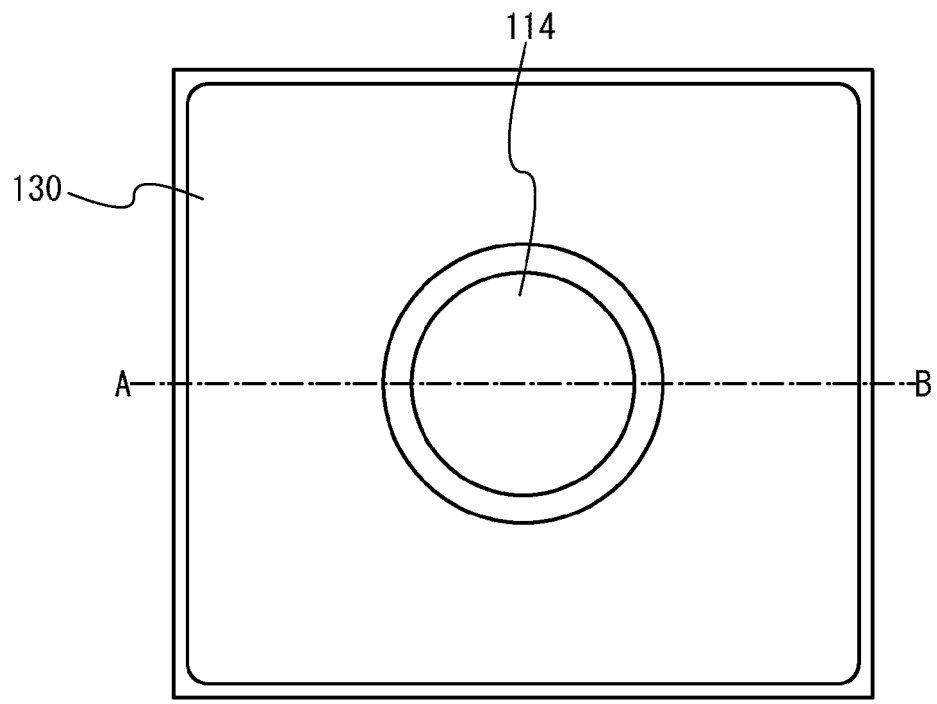
FIGS. 10A and 10B are respectively a plan view and a cross-sectional view which illustrate one mode of a semiconductor device formed using a semiconductor substrate.

In this embodiment, an example of a semiconductor device which uses a semiconductor substrate and serves as a bipolar transistor is described. In this embodiment, an example of a structure for providing a semiconductor device including a silicon carbide semiconductor is described. FIG. 10A is a plan view of the semiconductor device and FIG. 10B is a cross-sectional view taken along dashed line A-B in the plan view.

Figure 10B:
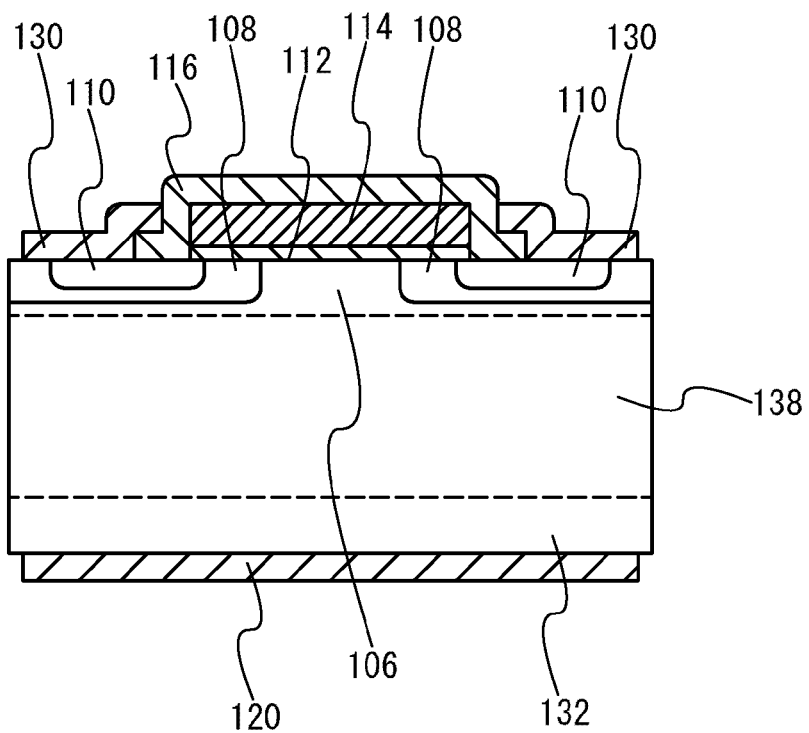

FIGS. 10A and 10B illustrate an example of a semiconductor device which serves as a bipolar transistor. The carbide semiconductor region 106 is provided inside a surface of the semiconductor substrate 138 and a channel formation is included in the carbide semiconductor region 106. The structure and operating principles of the semiconductor device of this embodiment are similar to those of the semiconductor device in Embodiment 3.

A surface part of the semiconductor substrate 138 is provided with the carbide semiconductor region 106. As in the semiconductor device in Embodiment 3, in the semiconductor device according to this embodiment, when positive bias is applied to the gate electrode 114, a channel is formed in the first impurity region 108. Since the third impurity region 122 has a p-type conductivity, holes are injected to the semiconductor layer 104 from the third impurity region 122 in an On state. Thus, voltage to make the semiconductor device into an On state is lowered.

The semiconductor device according to this embodiment has a structure of an insulated-gate field effect transistor on an input side and a structure of a bipolar transistor on an output side. This semiconductor device is driven with a voltage between the gate electrode 114 and the emitter electrode 130, and is turned on or off by input signals to the gate electrode 114. In the semiconductor device having this structure, switching operation can be faster, and self-heating is suppressed due to low on resistance, whereby control of a large amount of electrical power can be facilitated.

Embodiment 7

Figure 11:
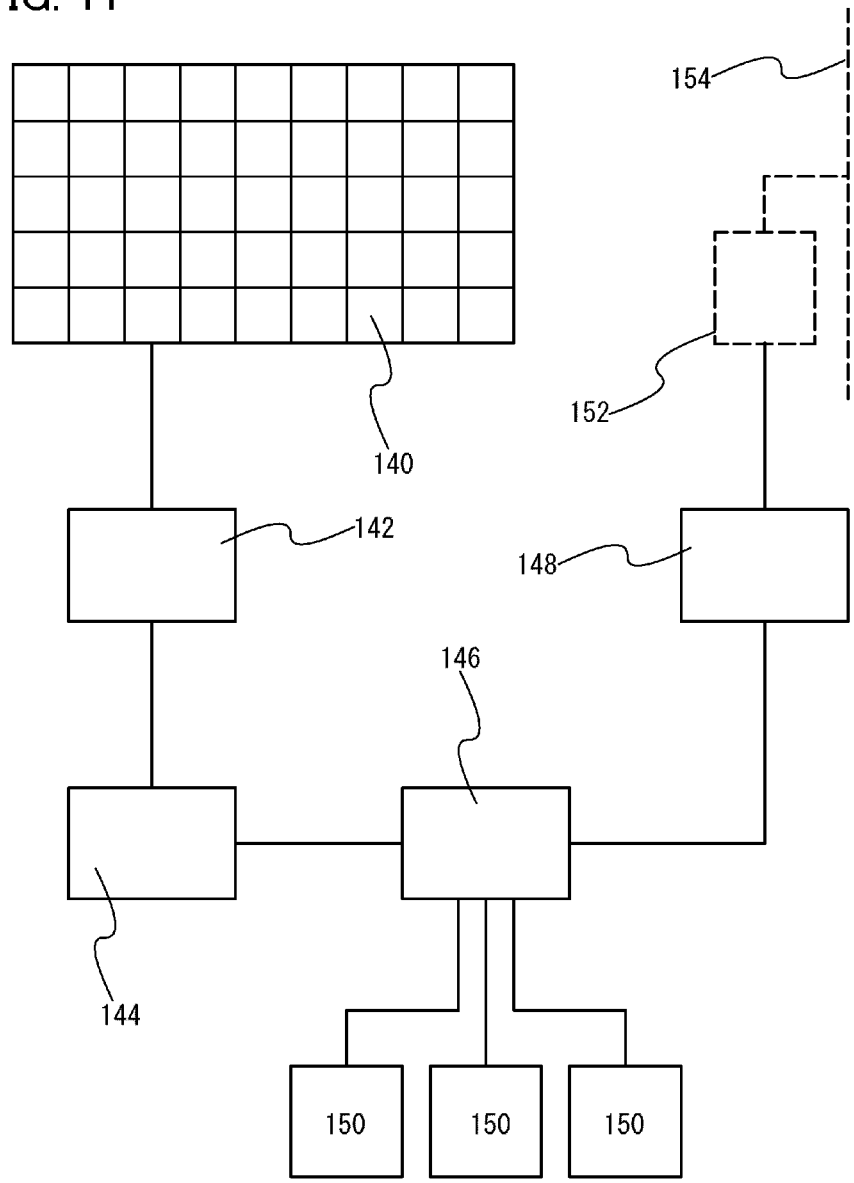
FIG. 11 illustrates an example of a solar power generation system provided with an inverter.

In this embodiment, an example of a solar power generation system provided with an inverter is described with reference to FIG. 11. This solar power generation system is structured to be installed on houses and the like.

Electricity generated by this solar power generation system for houses can be consumed in the house and the excess electricity can be returned to an electric grid 154. Electricity can be supplied from the electric grid 154 when the power generation system cannot generate electricity at night and when the amount of electricity generated is decreased because of rain.

A solar cell panel 140, which converts sunlight energy into electric energy, generates direct current electricity. An inverter 144 converts the direct current electricity into alternating current electricity. AC power output from the inverter 144 is used as electricity to operate various electric appliances 150.

The solar power generation system can be connected to the electric grid 154 so that excess electricity which is not consumed in the house can be sold to an electrical company. A DC switch 142 is provided to control connection or disconnection between the solar cell panel 140 and the inverter 144. An AC switch 148 is provided to connect or disconnect between the electric grid 154 and a distribution board 146 through a transformer 152.

By applying the semiconductor device of any of Embodiments 1 to 6 for the inverter, the inverter can be downsized. Thus, a high efficiency solar power generation system with reduced electrical power loss can be realized.

This application is based on Japanese Patent Application serial no. 2009-037717 filed with Japan Patent Office on Feb. 20, 2009, the entire contents of which are hereby incorporated by reference.

What is claimed is:

1. A method for manufacturing a semiconductor device comprising:
    forming a semiconductor layer having one conductivity type over an insulating surface;
    forming a carbide semiconductor region in a surface of the semiconductor layer;
    forming a first impurity region in the carbide semiconductor region, the first impurity region having an opposite conductivity type to the one conductivity type;
    forming a second impurity region in the carbide semiconductor region, the second impurity region having the one conductivity type and being surrounded by the first impurity region;
    forming a gate electrode over the semiconductor layer with a gate insulating layer interposed therebetween;
    forming a source electrode in contact with the first impurity region and the second impurity region; and
    forming a drain electrode in contact with the semiconductor layer;
    wherein the first impurity region overlaps with a part of the gate electrode.

2. The method for manufacturing a semiconductor device according to claim 1,
    wherein the carbide semiconductor region is formed by heating the semiconductor layer in an atmosphere containing a carbide gas and a hydrocarbon gas.

3. The method for manufacturing a semiconductor device according to claim 1,
    wherein the semiconductor layer comprises single crystal silicon and the carbide semiconductor region comprises silicon carbide.

4. The method for manufacturing a semiconductor device according to claim 1,
    wherein the drain electrode is in contact with the carbide semiconductor region.

5. The method for manufacturing a semiconductor device according to claim 1, further comprising the step of forming a third impurity region in the carbide semiconductor region, the third impurity region having the one conductivity type.

6. A method for manufacturing a semiconductor device comprising:
    forming a semiconductor layer having one conductivity type over an insulating surface;
    forming a carbide semiconductor region in a surface of the semiconductor layer;
    forming a first impurity region in the carbide semiconductor region, the first impurity region having an opposite conductivity type to the one conductivity type;
    forming a second impurity region in the carbide semiconductor region, the second impurity region having the one conductivity type and being surrounded by the first impurity region;
    forming a third impurity region in the carbide semiconductor region, the third impurity region having the opposite conductivity type to the one conductivity type;
    forming a gate electrode over the semiconductor layer with a gate insulating layer interposed therebetween; and
    forming a source electrode in contact with the first impurity region and the second impurity region; and
    forming a drain electrode in contact with the third impurity region;
    wherein the first impurity region overlaps with a part of the gate electrode.

7. The method for manufacturing a semiconductor device according to claim 6,
    wherein the carbide semiconductor region is formed by heating the semiconductor layer in an atmosphere containing a carbide gas and a hydrocarbon gas.

8. The method for manufacturing a semiconductor device according to claim 6,
    wherein the semiconductor layer comprises single crystal silicon and the carbide semiconductor region comprises silicon carbide.

9. The method for manufacturing a semiconductor device according to claim 6,
wherein the second impurity region is substantially outside a part of the carbide semiconductor region overlapping with the gate electrode.

10. A method for manufacturing a semiconductor device comprising:
forming a carbide semiconductor region in a one surface of a semiconductor substrate having one conductivity type;
forming a first impurity region in the carbide semiconductor region, the first impurity region having an opposite conductivity type to the one conductivity type;
forming a second impurity region in the carbide semiconductor region, the second impurity region having the one conductivity type and being surrounded by the first impurity region;
forming a gate electrode over the semiconductor substrate with a gate insulating layer interposed therebetween;
forming a source electrode in contact with the first impurity region and the second impurity region; and
forming a drain electrode on an opposite surface of the semiconductor substrate from the one surface of semiconductor substrate;
wherein the first impurity region overlaps with a part of the gate electrode.

11. The method for manufacturing a semiconductor device according to claim 10,
wherein the carbide semiconductor region is formed by heating the semiconductor substrate in an atmosphere containing a hydrocarbon gas while performing laser light irradiation.

12. The method for manufacturing a semiconductor device according to claim 10,
wherein the semiconductor substrate comprises single crystal silicon and the carbide semiconductor region comprises silicon carbide.

13. The method for manufacturing a semiconductor device according to claim 10,
wherein the second impurity region is substantially outside a part of the carbide semiconductor region overlapping with the gate electrode.

14. The method for manufacturing a semiconductor device according to claim 10, further comprising the step of forming an insulating layer over the gate electrode; and
wherein a part of the insulating layer is exposed.

15. The method for manufacturing a semiconductor device according to claim 10,
wherein a shape of the gate electrode is a circular shape.

16. The method for manufacturing a semiconductor device according to claim 14,
wherein a part of periphery of the insulating layer overlaps with a part of periphery of the source electrode.

17. The method for manufacturing a semiconductor device according to claim 10, further comprising the step of forming a third impurity region in the opposite surface of the semiconductor substrate from the one surface of semiconductor substrate, the third impurity region having the one conductivity type and being in contact with the drain electrode.

18. A method for manufacturing a semiconductor device comprising:
forming a carbide semiconductor region in a one surface of a semiconductor substrate having one conductivity type;
forming a first impurity region in the carbide semiconductor region, the first impurity region having an opposite conductivity type to the one conductivity type;
forming a second impurity region in the carbide semiconductor region, the second impurity region having the one conductivity type and being surrounded by the first impurity region;
forming a third impurity region in an opposite surface of the semiconductor substrate from the one surface, the third impurity region having the opposite conductivity type to the one conductivity type;
forming a gate electrode over the semiconductor substrate with a gate insulating layer interposed therebetween;
forming a source electrode in contact with the first impurity region and the second impurity region; and
forming a drain electrode in contact with the third impurity region;
wherein the first impurity region overlaps with a part of the gate electrode.

19. The method for manufacturing a semiconductor device according to claim 18,
wherein a part of the opposite surface of the semiconductor substrate is exposed.

20. The method for manufacturing a semiconductor device according to claim 18,
wherein the carbide semiconductor region is formed down to a depth of 5 nm to 15 nm from the one surface of the semiconductor substrate.

* * * * *